(12) United States Patent
Lumbantoruan et al.

(10) Patent No.: US 11,316,040 B2
(45) Date of Patent: Apr. 26, 2022

(54) HIGH ELECTRON MOBILITY TRANSISTOR

(71) Applicant: Vanguard International Semiconductor Corporation, Hsinchu (TW)

(72) Inventors: Franky Juanda Lumbantoruan, Sumatera Utara (ID); Chia-Ching Huang, Taoyuan (TW); Chih-Yen Chen, Tainan (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 17/020,800

(22) Filed: Sep. 14, 2020

(65) Prior Publication Data
US 2022/0085196 A1  Mar. 17, 2022

(51) Int. Cl.
*H01L 29/778* (2006.01)
(52) U.S. Cl.
CPC ............................ *H01L 29/7786* (2013.01)
(58) Field of Classification Search
CPC .................................................. H01L 29/7786
See application file for complete search history.

(56) References Cited

U.S. PATENT DOCUMENTS

| 7,576,373 | B1  | 8/2009  | Hikita  |              |
|-----------|-----|---------|---------|--------------|
| 8,383,471 | B1  | 2/2013  | Shinihara |            |
| 9,673,311 | B1* | 6/2017  | Moens   | H01L 29/41766 |
| 2005/0274980 | A1* | 12/2005 | Miyoshi | H01L 29/66469 |
|           |     |         |         | 257/192      |
| 2014/0097470 | A1  | 4/2014 | Kim     |              |

FOREIGN PATENT DOCUMENTS

| CN | 101022128 A  | 8/2007  |
|----|--------------|---------|
| TW | 201103077 A1 | 1/2011  |
| TW | 201340324 A  | 10/2013 |
| TW | 201630187 A  | 8/2016  |

\* cited by examiner

*Primary Examiner* — Fernando L Toledo
*Assistant Examiner* — Valerie N Newton
(74) *Attorney, Agent, or Firm* — Winston Hsu (57) ABSTRACT

A high electron mobility transistor includes a channel layer, a barrier layer, a first compound semiconductor layer, and a second compound semiconductor layer. The channel layer is disposed on the substrate, and the barrier layer is disposed on the channel layer. The first compound semiconductor layer is disposed on the barrier layer. The second compound semiconductor layer is disposed between the barrier layer and the first compound semiconductor layer, where the first compound semiconductor layer and the second compound semiconductor layer include a concentration distribution of metal dopant, and the concentration distribution of metal dopant includes a first peak in the first compound semiconductor layer and a second peak in the second compound semiconductor layer.

17 Claims, 7 Drawing Sheets

HIGH ELECTRON MOBILITY TRANSISTOR

BACKGROUND OF THE INVENTION

1. Field of the Invention

The present disclosure relates generally to the field of semiconductor devices, and more particularly to high-electron mobility transistors.

2. Description of the Prior Art

In semiconductor technology, group III-V compound semiconductors may be used to construct various integrated circuit (IC) devices, such as high power field-effect transistors (FETs), high frequency transistors, or high-electron mobility transistors (HEMTs). A HEMT is a field effect transistor having a layer of two dimensional electron gas (2-DEG) close to a junction between two materials with different bandgaps (i.e., a heterojunction). The 2-DEG layer is used as the carrier channel of a HEMT, which is different from conventional metal oxide semiconductor field effect transistors (MOSFETs) where a doped region is used as the carrier channel. Compared with MOSFETs, HEMTs have a number of attractive properties such as high electron mobility and the ability to transmit signals at high frequencies.

In order to switch a HEMT between on-state and off-state, a positive or negative voltage is usually applied to the gate electrode of the HEMT. However, for a conventional HEMT, due to the gate-lag effect, the threshold voltage (Vt) of the HEMT usually varies with the applied gate voltage. For example, the threshold voltage shift ($\Delta Vt$) is usually varied with respect to the on-state and the off-state of the HEMT, which is not beneficial to the rapid switching of the HEMT and thereby negatively affects the performance of the semiconductor device.

SUMMARY OF THE INVENTION

In view of this, it is necessary to provide an improved high-electron mobility transistor without the drawbacks described above.

According to one embodiment of the present disclosure, a high electron mobility transistor includes a channel layer, a barrier layer, a first compound semiconductor layer, and a second compound semiconductor layer. The channel layer is disposed on the substrate, and the barrier layer is disposed on the channel layer. The first compound semiconductor layer is disposed on the barrier layer. The second compound semiconductor layer is disposed between the barrier layer and the first compound semiconductor layer, where the first compound semiconductor layer and the second compound semiconductor layer include a concentration distribution of metal dopant, and the concentration distribution of metal dopant includes a first peak in the first compound semiconductor layer and a second peak in the second compound semiconductor layer.

According to one embodiment of the present disclosure, since the second compound semiconductor layer is disposed between the first compound semiconductor layer and the barrier layer, by forming the peak of the metal dopant distribution in the second compound semiconductor layer, the bandgap between the highest valence band of the second compound semiconductor layer and the highest valence band of the barrier layer may be increased. Therefore, the holes from the first compound semiconductor layer may not be injected into the barrier layer easily, thereby reducing not only the number of trapped charges in the barrier layer but the threshold voltage shift of the high electron mobility transistor. Therefore, the gate-lag effect may be avoided successfully, which is beneficial to the rapid switching of the high electron mobility transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, GaInP, AlGaAs, InAlAs, InGaAs, or the like, or the combination thereof. Besides, based on different requirements, group III-V semiconductor may contain dopants to become semiconductor with specific conductivity type, such as N-type or p-type.

Although the present disclosure is described with respect to specific embodiments, the principles of the invention, as defined by the claims appended herein, may obviously be applied beyond the specifically described embodiments of the invention described herein. Moreover, in the description of the present disclosure, certain details have been left out in order to not obscure the inventive aspects of the present disclosure. The details left out are within the knowledge of a person of ordinary skill in the art.

The present disclosure is directed to high voltage semiconductor devices or high electron mobility transistors (HEMTs), such as power switching transistors for voltage converter applications. Compared to silicon power transistors, group III-V HEMTs feature low on-state resistance ($R_{ON}$) and low switching losses due to wide bandgap properties.

Figure 1:
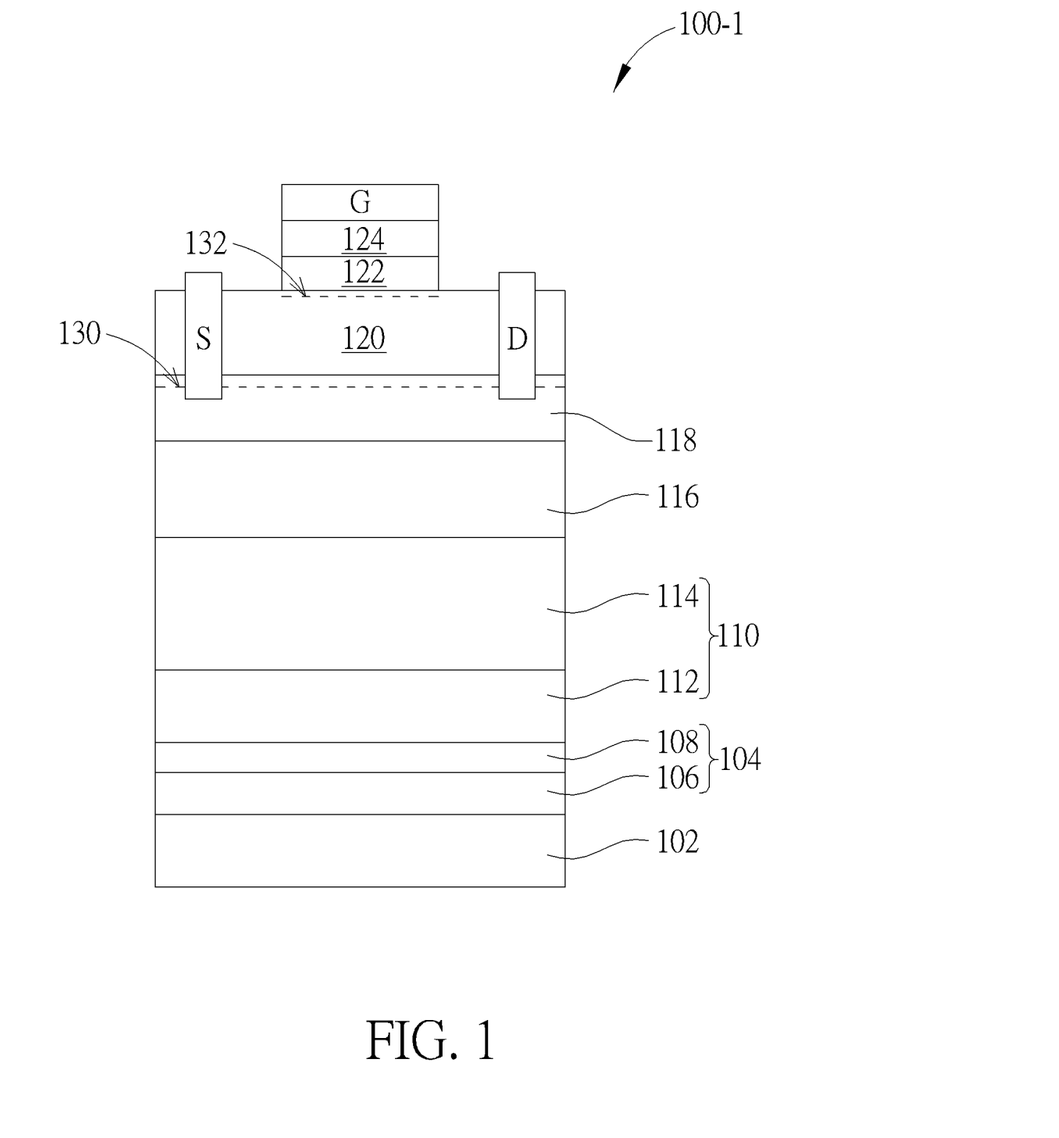
FIG. 1 is a schematic cross-sectional diagram of a semiconductor stack of a high-voltage semiconductor device, where the semiconductor stack includes at least one p-type group III-V intermediate layer, according to one embodiment of the present disclosure.

FIG. 1 is a schematic cross-sectional diagram of a semiconductor stack of a high-voltage semiconductor device according to one embodiment of the present disclosure, where the semiconductor stack includes at least a p-type group III-V intermediate layer. Referring to FIG. 1, the high electron mobility transistor 100-1 includes a substrate 102, a semiconductor stack (e.g., at least a group III-V channel layer 118, a group III-V barrier layer 120, and a p-type group III-V intermediate layer (also called a second compound semiconductor layer) 122, and a first compound semiconductor layer 124), a source electrode S, a drain electrode D, and a gate electrode G. Additional layers, such as a nitride layer 104, a superlattice layer 110, and a high-resistance layer 116, may be optionally disposed between the substrate 102 and the semiconductor stack.

According to one embodiment of the present disclosure, the substrate 102 may be a ceramic substrate such as silicon carbide (SiC), aluminum oxide ($Al_2O_3$), sapphire, aluminum nitride and so forth. According to one embodiment of the present disclosure, a binding layer, such as a layer including silicon, may be disposed on the surface of the substrate 102. According to one embodiment of the present disclosure, the substrate 102 may further include a core layer, a single or multiple insulating layers wrapping the core layer, and/or other suitable material layers. The core layer may be aluminum nitride or aluminum oxide, and the insulating layers may be oxide, nitride, oxynitride, or other suitable insulating materials.

The nitride layer 104 may be optionally disposed on the substrate 102. Because the nitride layer 104 contain little lattice defects, the nitride layer 104 may be formed to improve the epitaxial quality of the semiconductor stack layer disposed on the nitride layer 104. The nitride layer 104 may include a nitride stack layer, such as a first nitride layer 106 and a second nitride layer 108. According to one embodiment of the present disclosure, the first nitride layer 106 may be, for example, a low-temperature aluminum nitride layer (LT-AlN), and the LT-AlN may be formed by metal-organic chemical vapor deposition (MOCVD) at a processing temperature of 800° C. to 1100° C. The second nitride layer 108 may be, for example, a high temperature aluminum nitride layer (HT-AlN), and the HT-AlN may be formed by organic metal chemical vapor deposition at a processing temperature of 1100° C. to 1400° C., but not limited thereto.

The superlattice layer (SL) 110 may be optionally disposed on the substrate 102, for example, on the nitride layer 104. The superlattice layer 110 may be used to reduce the degree of lattice mismatch between the substrate 102 and the semiconductor layer disposed on the superlattice layer 110, and to reduce the stress caused by the lattice mismatch. According to one embodiment of the present disclosure, the superlattice layer 110 may be a superlattice stack layer including, for example, a first superlattice layer 112 and a second superlattice layer 114. In order to meet different requirements, the first superlattice layer 112 or the second superlattice layer 114 may each be a structure including a periodic alternating stack of at least two group III-V semiconductor layers, such as an alternating stack of thin AlN layers and thin GaN layers. As an alternative, the first superlattice layer 112 or the second superlattice layer 114 may each be a group III-V compound semiconductor layer with a gradually changing composition ratio, such as graded aluminum gallium nitride ($Al_xGa_{1-x}N$, $0.15 \leq x \leq 0.9$) where there is a gradual change in the Al ratio from bottom to top, but not limited thereto.

The high-resistance layer 116 may be optionally disposed on the substrate 102, for example, on the superlattice layer 110. The high-resistance layer 116 has a higher resistivity than other layers, so that less or even no leakage current would be generated between a semiconductor layer disposed on the high-resistance layer 116, and the substrate 102. According to one embodiment of the present disclosure, the high-resistance layer 116 may be a doped group III-V semiconductor layer, such as carbon-doped gallium nitride (c-GaN), but not limited thereto.

The channel layer 118 (i.e., the group III-V channel layer described below) may be disposed on the substrate 102, for example, on the high-resistance layer 116. The group III-V channel layer 118 may include one or more group III-V semiconductor layers, and the composition of the group III-V semiconductor layer may be GaN, AlGaN, InGaN, or InAlGaN, but not limited thereto. According to one embodiment of the present disclosure, the group III-V channel layer 118 is an undoped group III-V semiconductor, such as undoped-GaN (u-GaN). According to other embodiments of the present disclosure, the group III-V channel layer 118 may also be one or more doped group III-V semiconductor layers, such as a p-type group III-V semiconductor layer. For the p-type group III-V semiconductor layer, the dopant may be Cd, Fe, Mg or Zn, but not limited thereto.

The barrier layer 120 (i.e. the group III-V barrier layer described below) may be disposed on the group III-V channel layer 118. The group III-V barrier layer 120 may include one or more group III-V semiconductor layers, and its composition may be different from that of the group III-V semiconductor of the group III-V body layer 104. For example, the group III-V barrier layer 120 may include AlN, $Al_yGa_{(1-y)}N$ ($0<y<1$), or a combination thereof. According to one embodiment of the present disclosure, the group III-V barrier layer 120 may be an n-type group III-V semiconductor, for example, an intrinsic n-type AlGaN layer, but not limited thereto.

Since there is a bandgap discontinuity between the group III-V channel layer 118 and the group III-V barrier layer 120, by stacking the group III-V channel layer 118 and the group III-V barrier layer 120 on each other, a thin layer of two-dimensional electron gas (2-DEG) with high carrier mobility may be accumulated in a region, i.e., 2-DEG region 130, near the heterojunction between the group III-V channel layer 118 and the group III-V barrier layer 120 due to the piezoelectric effect.

The first compound semiconductor layer 124 may be disposed on the group III-V barrier layer 120 to deplete portions of the 2-DEG region 130. In this way, the corresponding semiconductor device could be normally-off in operation. The first compound semiconductor layer 124 may be a p-type group III-V semiconductor, such as a p-type GaN layer, but not limited thereto. In addition, the bandgap of the first compound semiconductor layer 124 may be smaller than the bandgap of the group III-V barrier layer 120 so that there is a bandgap discontinuity between the first compound semiconductor layer 124 and the group III-V barrier layer 120.

The p-type group III-V intermediate layer (also called a second compound semiconductor layer) 122 may be disposed between the group III-V barrier layer 120 and the first compound semiconductor layer 124, and the thickness of the p-type group III-V intermediate layer 122 may be thinner than the thicknesses of the barrier layer 120 and the first compound semiconductor layer 124. For example, the thickness of the p-type group III-V intermediate layer 122 may be 20 nm, and the thicknesses of the group III-V barrier layer 120 and the first compound semiconductor layer 124 may be 50 nm and 35 nm, respectively, but not limited thereto. According to one embodiment of the present disclosure, the p-type group III-V intermediate layer 122 is a p-type group III-V semiconductor, such as a p-type GaN layer, and the dopants of the p-type group III-V intermediate layer 122 may be metal dopants including Mg, Cd, or Zn. According to one embodiment of the present disclosure, the peak concentration of the dopants in the p-type group III-V intermediate layer 122 may range from 9E18 $cm^{-3}$ to 2E19 $cm^{-3}$, which is lower than the peak concentration of the dopants in the first compound semiconductor layer 124 (for example, from 1E19 $cm^{-3}$ to 1E20 $cm^{-3}$).

Since there is a bandgap discontinuity between the p-type group III-V intermediate layer 122 and the group III-V barrier layer 120, by stacking the p-type group III-V intermediate layer 122 and the group III-V barrier layer 120 on each other, a thin layer of two-dimensional hole gas (2-DHG) with high carrier mobility may be accumulated in a region, i.e., 2-DHG region 132, near the heterojunction between the p-type group III-V intermediate layer 122 and the group III-V barrier layer 120 due to the piezoelectric effect.

The source electrode S and the drain electrode D may be electrically coupled to the group III-V channel layer 118, respectively, and the gate electrode G may be electrically coupled to the first compound semiconductor layer 124. The source electrode S and the drain electrode D may form an ohmic contact with the group III-V channel layer 118, and the gate electrode G may form a Schottky contact with the first compound semiconductor layer 124, but not limited thereto.

Figure 2:
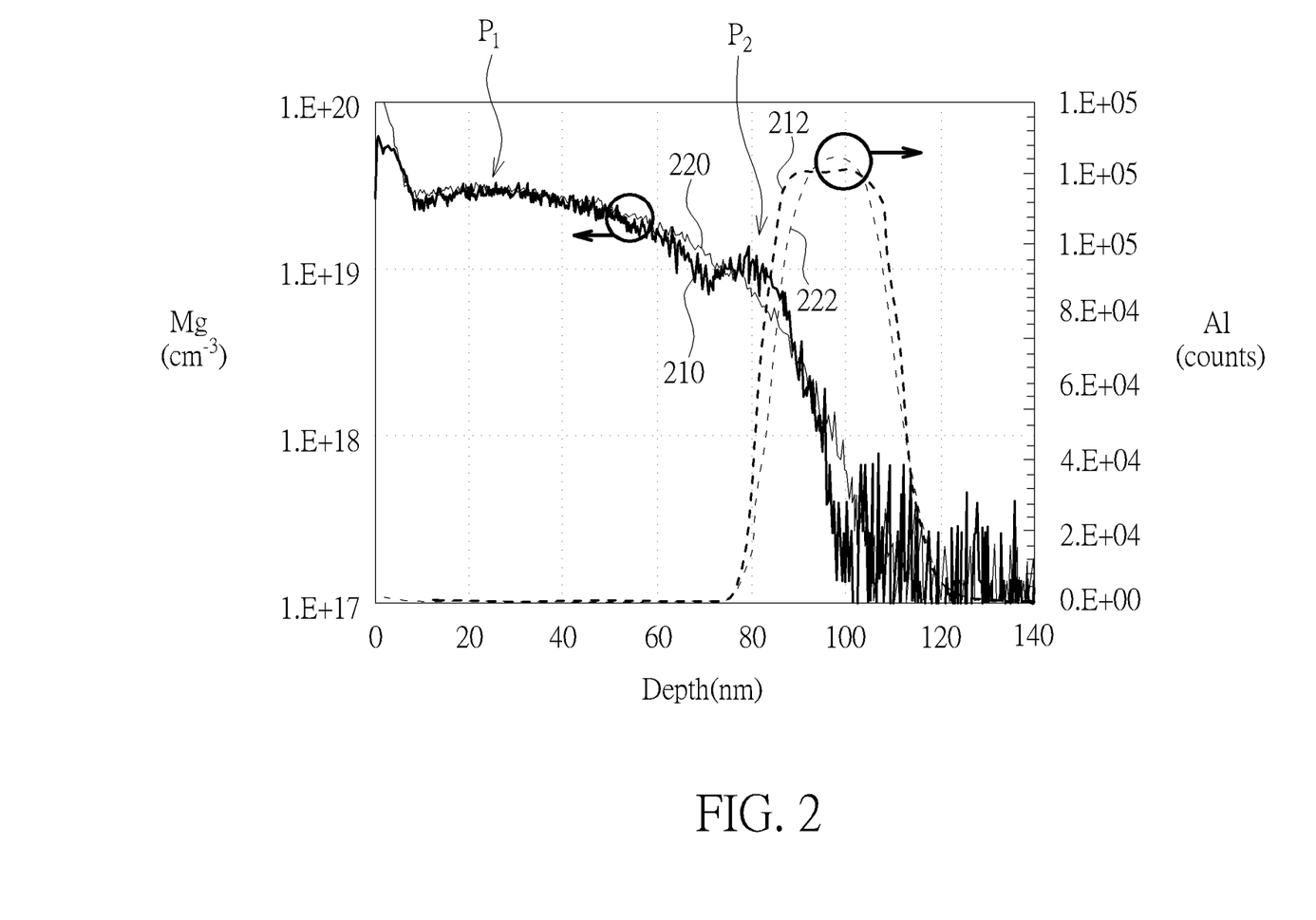
FIG. 2 shows the relationship between a doping concentration and the corresponding depth of a semiconductor stack according to one embodiment of the present disclosure.

In order to analyze the concentration distribution in a semiconductor stack, a secondary ion mass spectroscopy (SIMS) may be utilized to determine the concentration distribution of the metal components at different depths of the semiconductor stack shown in FIG. 1. The measurement result is shown in FIG. 2. FIG. 2 shows the relationship between the doping concentration and the depth of a semiconductor stack according to one embodiment of the present disclosure. Referring to FIG. 2, curve 210 and curve 212 respectively correspond to the concentration distributions of Mg and Al at different depths in the semiconductor stack according to one example of the present disclosure, while curve 220 and curve 222 respectively correspond to the concentration distributions of Mg and Al at different depths in the semiconductor stack (without a second compound semiconductor layer 122) according to comparative example 1. According to some embodiments of the present disclosure, a depth range of 0 nm to 70 nm in FIG. 2 may approximately correspond to the first compound semiconductor layer 124 shown in FIG. 1, a depth range of 70-85 nm may approximately correspond to the second compound semiconductor layer 122 shown in FIG. 1, a depth range of 85-120 nm may approximately correspond to the group III-V barrier layer 120 shown in FIG. 1, and a depth range of 120-140 nm may approximately correspond to the group III-V channel layer 118 shown in FIG. 1. For the curve 210, there is a peak $P_2$ in a depth range of 70-85 nm (i.e., corresponding to the second compound semiconductor layer). The full width at half maximum (FWHM) of the peak $P_2$ is approximately 5 nm to 15 nm, and the highest concentration (or peak concentration) of the peak $P_2$ is approximately 1.5E19 cm$^{-3}$. Besides, for the curve 210, the highest concentration in a depth range of 0-70 nm is approximately 5E19 cm$^{-3}$ (corresponding to a depth range of 2-5 nm), and the lowest concentration in a depth range of 0-70 nm is approximately 7E18 cm$^{-3}$ (corresponding to a depth of 70 nm). In contrast, the curve 220 (indicating the concentration distribution of Mg) in a depth range of 40-100 nm does not have any peak. It should be noted that, referring to FIG. 2, the concentration distribution of the metal dopants is preferably measured by a secondary ion mass spectrometer or a measurement apparatus with higher resolution. When a measurement apparatus with poor resolution is used, the peak of the concentration distribution in the second compound semiconductor layer may not be shown as expected.

Figure 3:
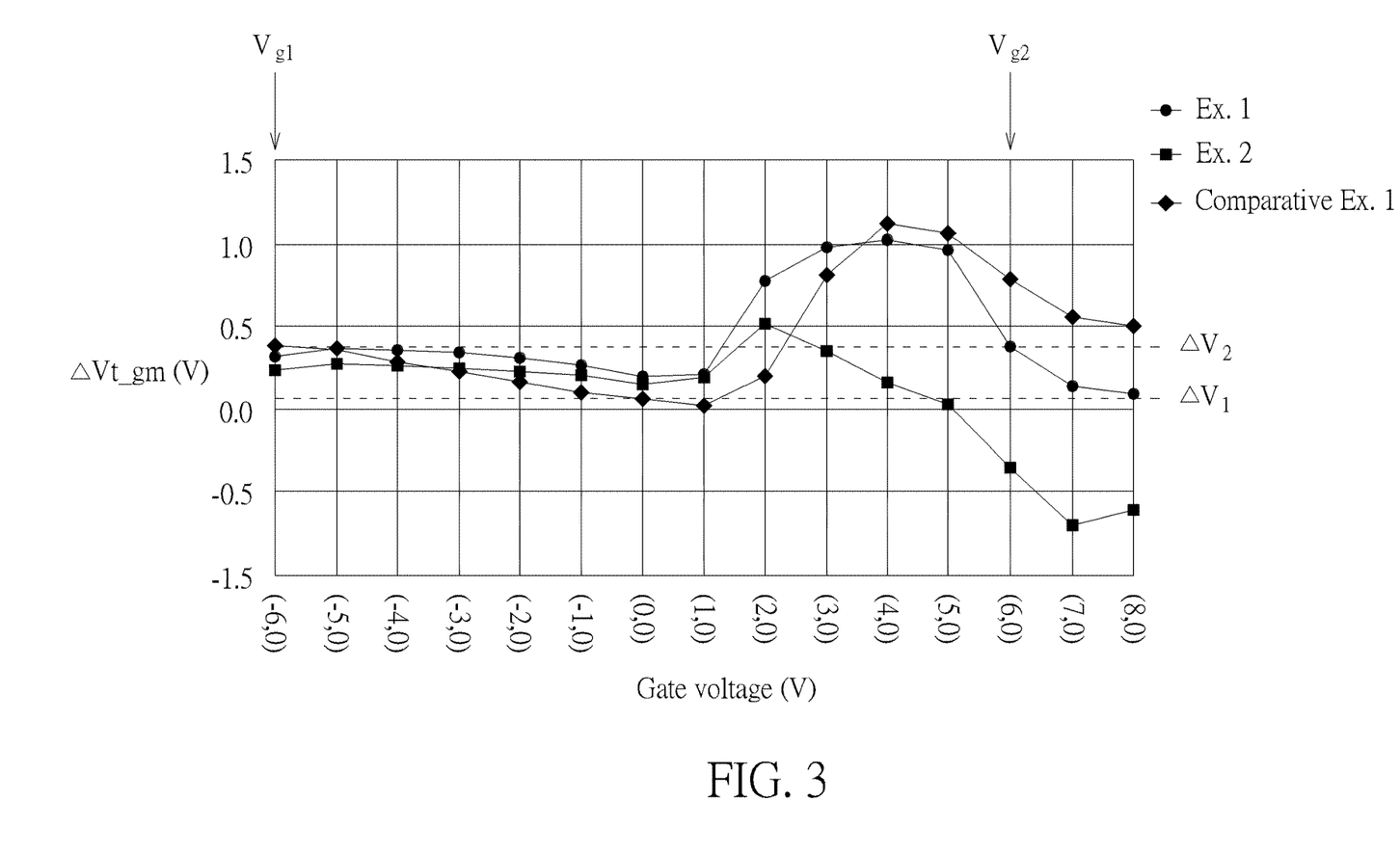
FIG. 3 shows the relationship between a threshold voltage shift and an applied gate voltage according to examples 1 and 2 and comparative example 1 of the present disclosure.
Figure 4:
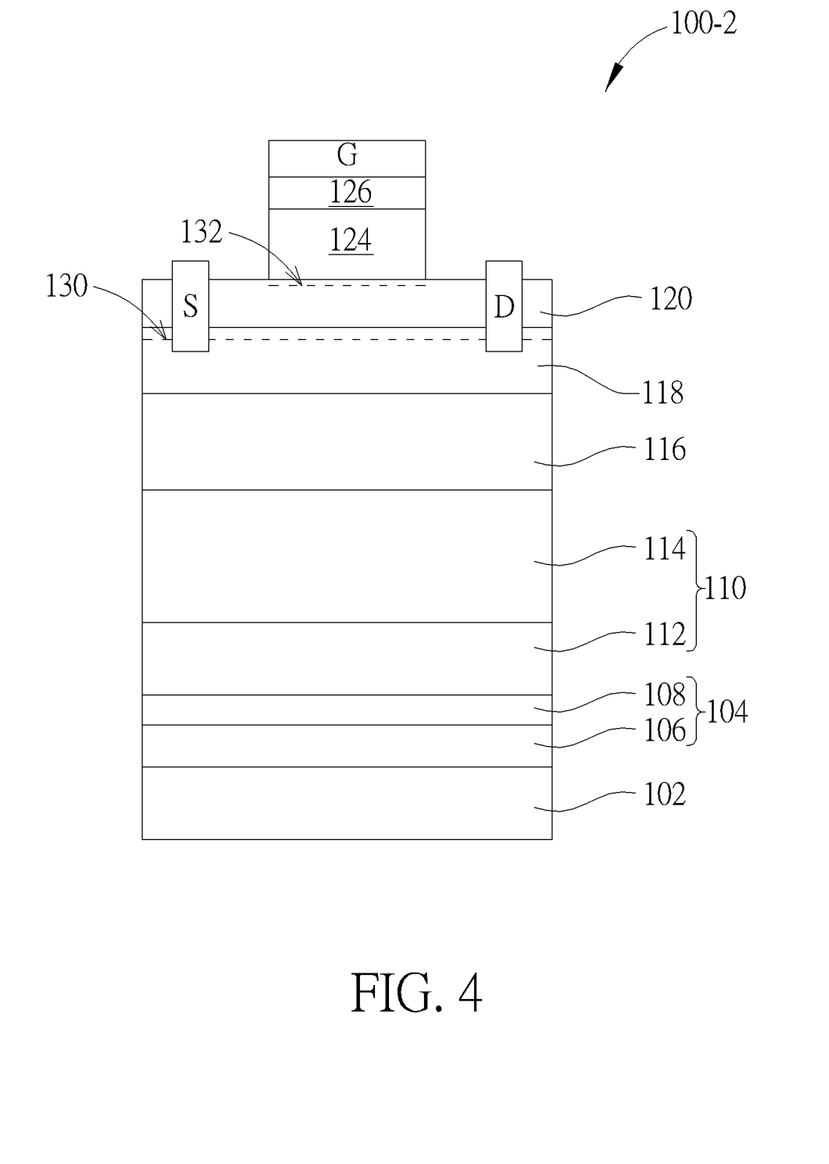
FIG. 4 is a schematic cross-sectional diagram of a semiconductor stack of a high-voltage semiconductor device, where the semiconductor stack includes at least one silicon cap layer, according to one embodiment of the present disclosure.

In order to determine the influence of the second compound semiconductor layer in the high electron mobility transistor on the gate-lag effect, the threshold voltage shift under different gate voltages (also called stress voltages) may be further analyzed, and the measurement results are shown in FIG. 3. FIG. 3 shows the relationship between a threshold voltage shift and a gate voltage according to examples 1 and 2 and comparative example 1 of the present disclosure. Referring to FIG. 1, FIG. 3, and FIG. 4, the structure of example 1 in FIG. 3 may be similar to the structure shown in FIG. 1, while the structure of example 2 in FIG. 3 may be similar to the structure shown in FIG. 4. The main difference between the structures shown in FIG. 4 and FIG. 1 is that the semiconductor stack shown in FIG. 4 does not include a second compound semiconductor layer 122, but includes a crystalline silicon-containing compound semiconductor layer 126 disposed on a first compound semiconductor layer 124. Besides, the structure of comparative example 1 in FIG. 3 may be a semiconductor stack similar to the structure shown in FIG. 1 but without a second compound semiconductor layer 122.

Referring to FIG. 3, when the gate voltage is set at either a first gate voltage $V_{g1}$ or a second gate voltage $V_{g1}$, such as −6V or 6V, the high electron mobility transistor may be either in the off-state or on-state. For example 1, when the gate voltage is set at the first gate voltage $V_{g1}$ or the second gate voltage $V_{g1}$, the corresponding threshold voltage shifts are approximately equal, which are in a range between a first threshold voltage shift $\Delta V_1$ and the second threshold voltage shift $\Delta V_2$. The result indicates that the high electron mobility transistor of example 1 does not show significant gate-lag effect. For example 2, when the gate voltage is set at the second gate voltage $V_{g2}$, the corresponding threshold voltage shift is slightly lower than the first threshold voltage shift $\Delta V_1$, instead of in a range between the first threshold voltage shift $\Delta V_1$ and the second threshold voltage shift $\Delta V_2$. The result indicates that the high electron mobility transistor of example 2 shows gate-lag effect when the high electron mobility transistor is turned on. In contrast, for comparative example 1, when the gate voltage is set at the first gate voltage $V_{g1}$, the corresponding threshold voltage shift is much larger than the first threshold voltage shift $\Delta V_1$. Therefore, the gate-lag effect of comparative example 1 is more serious than that of examples 1 and 2.

In order to meet different requirements, one of ordinary skill in the art could understand that many modifications and variations are also possible in light of this disclosure. In the following paragraphs, various modifications and variations about high electron mobility transistors are disclosed and the description below is mainly focused on differences among these embodiments. In addition, the present disclosure may repeat reference numerals and/or letters in the various modifications and variations. This repetition is for the purpose of simplicity and clarity and does not in itself dictate a relationship between the various embodiments and/or configurations discussed.

FIG. 4 is a schematic cross-sectional diagram of a semiconductor stack of a high-voltage semiconductor device according to one embodiment of the present disclosure, where the semiconductor stack includes at least one silicon-containing compound semiconductor layer. Referring to FIG. 4, the structure 100-2 shown in FIG. 4 is similar to the structure 100-1 shown in FIG. 1, and the main difference is that, for the structure 100-2 shown in FIG. 4, no second compound semiconductor layer 122 is disposed between the group III-V barrier layer 120 and the first compound semiconductor layer 124, but another compound semiconductor layer is disposed on the first compound semiconductor layer 124. According to one embodiment of the present disclosure, the compound semiconductor layer disposed on the first compound semiconductor layer 124 may be a crystalline silicon compound semiconductor layer 126. Since the bandgap between the crystalline silicon compound semiconductor layer 126 and the first compound semiconductor layer 124 is discontinuous, holes may be transported from the gate electrode to the first compound semiconductor layer 124 more easily.

Figure 5:
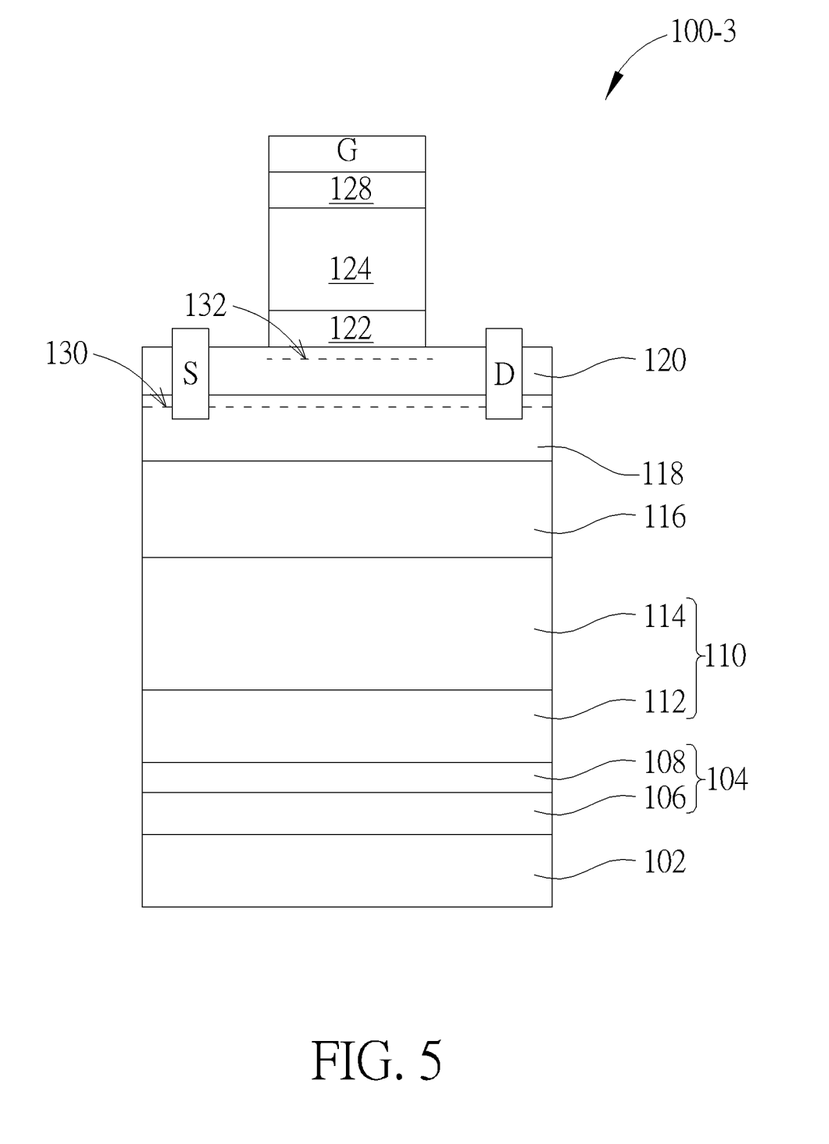
FIG. 5 is a schematic cross-sectional diagram of a semiconductor stack of a high-voltage semiconductor device, where the semiconductor stack includes at least one second compound semiconductor layer and one p-type group III-V compound semiconductor layer, according to one embodiment of the present disclosure.

FIG. 5 is a schematic cross-sectional diagram of a semiconductor stack of a high-voltage semiconductor device according to one embodiment of the present disclosure, where the semiconductor stack includes at least one second compound semiconductor layer and one p-type group III-V compound semiconductor layer. Referring to FIG. 5, the structure 100-3 shown in FIG. 5 is similar to the structure 100-1 shown in FIG. 1. The main difference between FIG. 4 and FIG. 1 is that, in addition to the second compound semiconductor layer 122, an additional p-type group III-V compound semiconductor layer 128 is disposed on the first compound semiconductor layer 124. According to one embodiment of the present disclosure, the p-type group III-V compound semiconductor layer 128 may be p$^+$-type GaN with a high doping concentration, which may be used to facilitate the injection of holes. The p-type group III-V compound semiconductor layer 128 and the first compound semiconductor layer 124 may include the same metal dopants, such as Mg, and the doping concentration of the p-type group III-V compound semiconductor layer 128 is higher than the doping concentration of the first compound semiconductor layer 124.

Figure 6:
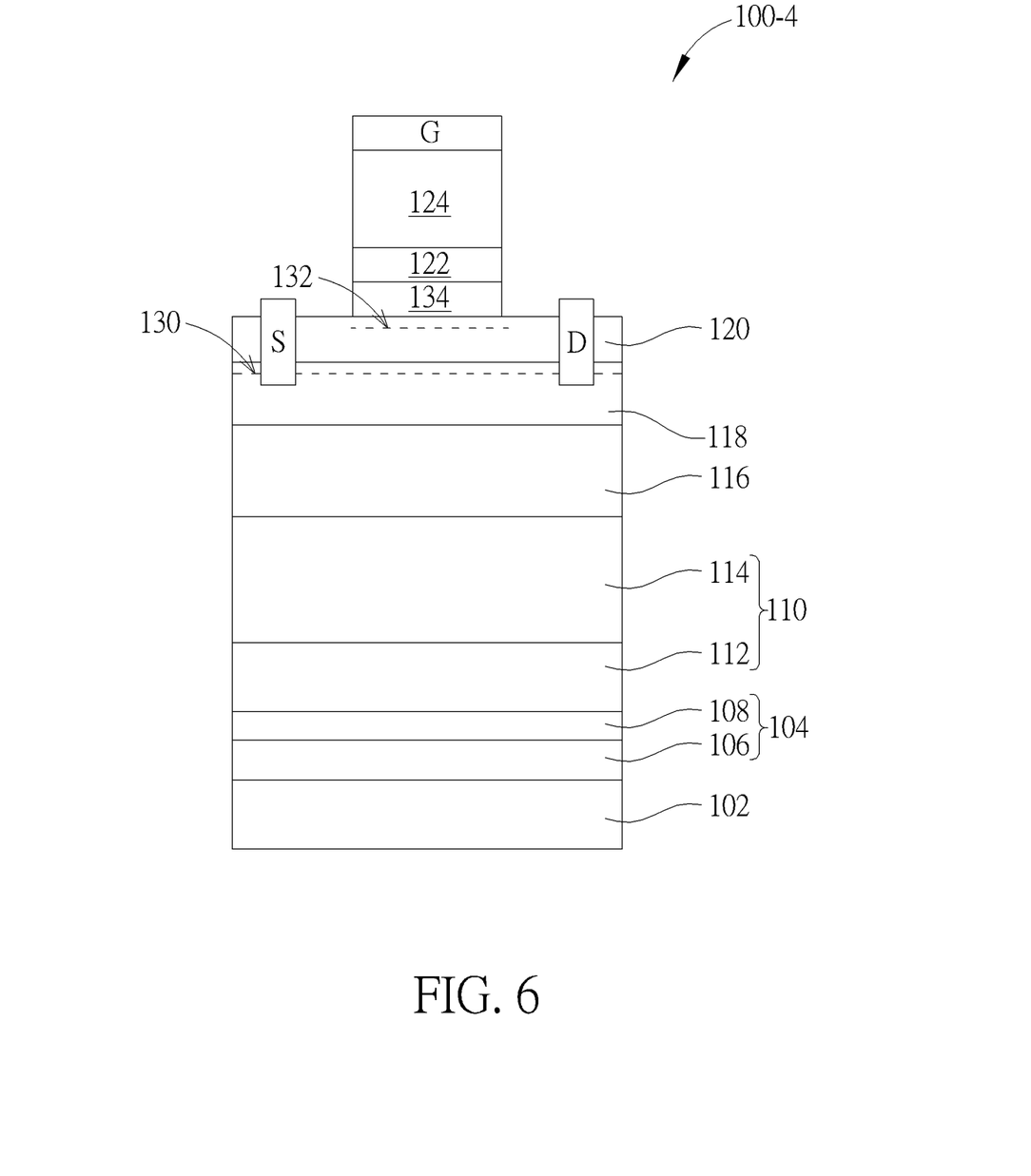
FIG. 6 is a schematic cross-sectional diagram of a semiconductor stack of a high-voltage semiconductor device, where the semiconductor stack includes at least one second compound semiconductor layer and one p-type group III-V barrier layer, according to one embodiment of the present disclosure.

FIG. 6 is a schematic cross-sectional diagram of a semiconductor stack of a high-voltage semiconductor device according to one embodiment of the present disclosure, where the semiconductor stack includes at least one second compound semiconductor layer and one p-type group III-V barrier layer. Referring to FIG. 6, the structure 100-4 shown in FIG. 6 is similar to the structure 100-1 shown in FIG. 1, the main difference is that, in addition to a second compound semiconductor layer 122, an additional p-type group III-V barrier layer 134 is disposed between the group III-V barrier layer 120 and the second compound semiconductor layer 122. According to one embodiment of the present disclosure, the p-type group III-V barrier layer 134 may be a p-type AlGaN with a low dopant concentration, which may be used to increase the threshold voltage ($V_{th}$) and reduce the number of electrons trapped by the group III-V barrier layer 120. The p-type group III-V barrier layer 134 and the second compound semiconductor layer 122 may include the same metal dopants, such as Mg, and the doping concentration of the p-type group III-V barrier layer 134 is lower than the doping concentration of the second compound semiconductor layer 122.

Figure 7:
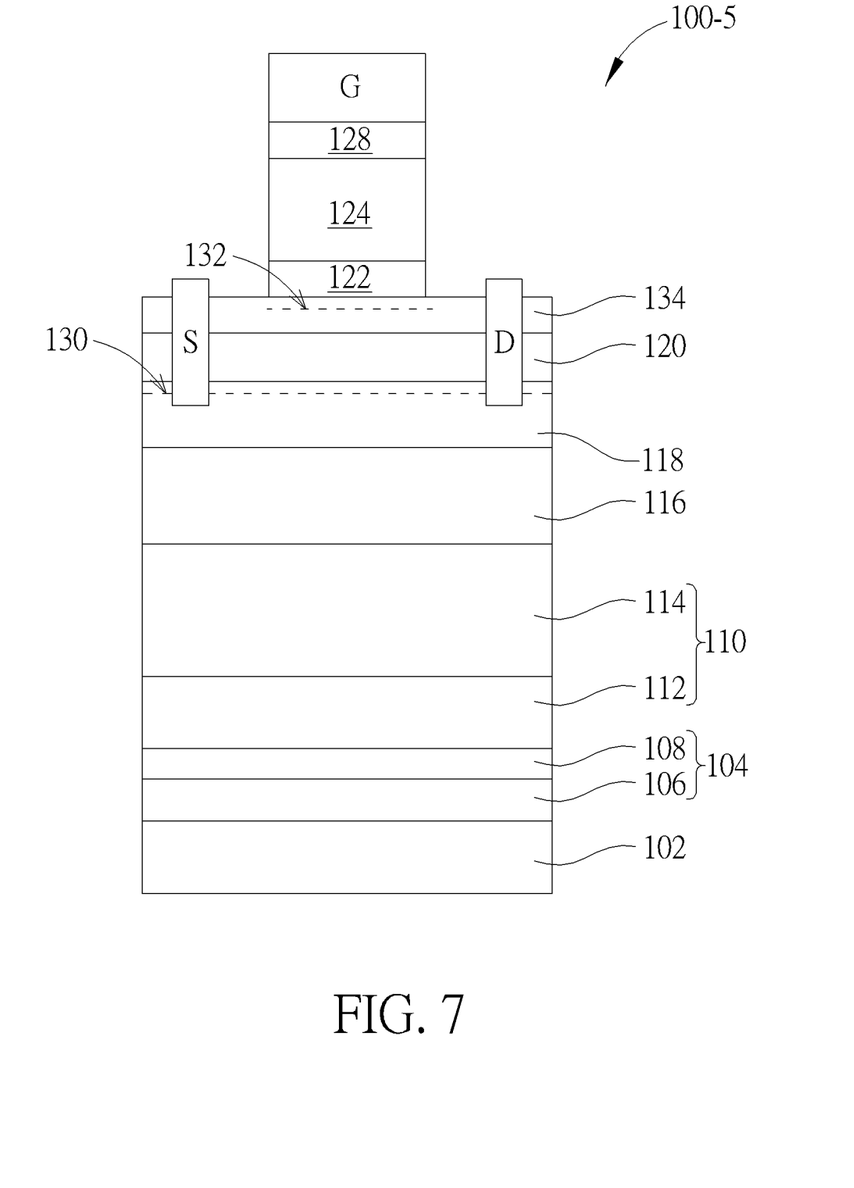
FIG. 7 is a schematic cross-sectional diagram of a semiconductor stack of a high-voltage semiconductor device, where the semiconductor stack includes at least one second compound semiconductor layer, one p-type group III-V barrier layer, and one p-type group III-V compound semiconductor layer, according to one embodiment of the present disclosure.

FIG. 7 is a schematic cross-sectional diagram of a semiconductor stack of a high-voltage semiconductor device according to one embodiment of the present disclosure, where the semiconductor stack includes at least one second compound semiconductor layer, one p-type group III-V barrier layer, and one p-type group III-V compound semiconductor layer. Referring to FIG. 7, the structure 100-5 shown in FIG. 7 is similar to the structure 100-1 shown in FIG. 1. The main difference is that, in addition to the second compound semiconductor layer 122, the structure 100-5 shown in FIG. 7 further includes a p-type group III-V compound semiconductor layer 128 and a p-type group III-V barrier layer 134. The p-type group III-V compound semiconductor layer 128 is disposed on the first compound semiconductor layer 124, and the p-type group III-V barrier layer 134 is disposed between the group III-V barrier layer 120 and the second compound semiconductor layers 122.

According to the foregoing embodiments, since the second compound semiconductor layer is disposed between the first compound semiconductor layer and the group III-V barrier layer, by forming the concentration peak of the metal dopants in the second compound semiconductor layer, the bandgap between the highest valence band of the second compound semiconductor layer and the highest valence band of the barrier layer may be increased. Therefore, the holes from the first compound semiconductor layer may not be injected into the barrier layer easily, thereby reducing not only the number of trapped charges in the group III-V barrier layer but also the threshold voltage shift of the high electron mobility transistor. Therefore, the gate-lag effect may be avoided successfully, which is beneficial to the rapid switching of the high electron mobility transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor, including:
a channel layer disposed on a substrate;
a barrier layer disposed on the channel layer;
a first compound semiconductor layer disposed on the barrier layer; and
a second compound semiconductor layer disposed between the barrier layer and the first compound semiconductor layer, wherein the first compound semiconductor layer and the second compound semiconductor layer comprise a concentration distribution of metal dopants, and the concentration distribution comprises a first peak in the first compound semiconductor layer and a second peak in the second compound semiconductor layer.

2. The high electron mobility transistor of claim 1, wherein the metal dopants are magnesium, cadmium, carbon or zinc.

3. The high electron mobility transistor of claim 1, wherein the concentration of the metal dopants in the first compound semiconductor layer is higher than the concentration of the metal dopants in the second compound semiconductor layer.

4. The high electron mobility transistor of claim 1, wherein the concentration of the first peak is from 1E19 $cm^{-3}$ to 1E20 $cm^{-3}$, and the concentration of the second peak is from 9E18 $cm^{-3}$ to 2E19 $cm^{-3}$.

5. The high electron mobility transistor of claim 1, wherein a full width at half maximum (FWHM) of the second peak is from 5 nm to 15 nm.

6. The high-electron mobility transistor of claim 1, wherein the channel layer is an undoped group III-V channel layer.

7. The high electron mobility transistor of claim 1, wherein a two-dimensional electron gas (2-DEG) region is formed in the channel layer, and the 2-DEG region adjoins the junction of the channel layer and the barrier layer.

8. The high electron mobility transistor of claim 1, wherein the thickness of the second compound semiconductor layer is less than the thickness of the barrier layer and the thickness of the first compound semiconductor layer, respectively.

9. The high electron mobility transistor of claim 1, wherein a two-dimensional hole gas (2-DHG) region is formed in the second compound semiconductor layer, and the 2-DHG region adjoins the junction of the barrier layer and the second compound semiconductor layer.

10. The high electron mobility transistor of claim 1, further comprising a semiconductor cap layer disposed on the second compound semiconductor layer.

11. The high electron mobility transistor of claim 10, wherein the semiconductor cap layer is a crystalline silicon cap layer.

12. The high electron mobility transistor of claim 10, wherein the semiconductor cap layer is a p-type cap layer, the p-type cap layer and the first compound semiconductor layer comprise the metal dopants, and the concentration of the metal dopants in the p-type cap layer is higher than the concentration of the metal dopants in the first compound semiconductor layer.

13. The high electron mobility transistor of claim 1, further comprising a p-type barrier layer disposed between the barrier layer and the second compound semiconductor layer, and the p-type barrier the layer comprises the metal dopants.

14. The high electron mobility transistor of claim 13, wherein the concentration of the metal dopants in the p-type barrier layer is lower than the concentration of the metal dopants in the second compound semiconductor layer.

15. The high electron mobility transistor of claim 1, further comprising:
a gate electrode electrically coupled to the first compound semiconductor layer; and
at least two source/drain electrodes respectively electrically coupled to the channel layer.

16. The high electron mobility transistor of claim 15, wherein the first compound semiconductor layer and the second compound semiconductor layer are laterally spaced apart from the at least two source/drain electrodes.

17. The high electron mobility transistor of claim 1, wherein the first compound semiconductor layer and the second compound semiconductor layer are p-type group III-V semiconductor layers.

* * * * *